United States Patent [19]
Ito et al.

[11] Patent Number: 5,937,278
[45] Date of Patent: Aug. 10, 1999

[54] METHOD OF MANUFACTURING LEAD FRAME HAVING INNER LEAD CONNECTED TO OUTER LEAD BY METAL ETCH STOP LAYER

[75] Inventors: Makoto Ito; Kenji Ohsawa; Mutsumi Nagano, all of Kanagawa, Japan

[73] Assignee: Sony Corporation, Tokyo, Japan

[21] Appl. No.: 08/732,817

[22] Filed: Oct. 15, 1996

[51] Int. Cl.[6] .............................. H01L 21/44; H01L 21/60
[52] U.S. Cl. ............................ 438/123; 438/111; 438/112
[58] Field of Search .................................... 438/111, 112, 438/123; 257/673, 737, 766, 676, 781, 677, 787, 690; 29/827; 216/12

[56] References Cited

U.S. PATENT DOCUMENTS

| | | |
|---|---|---|
| 4,736,236 | 4/1988 | Butt . |
| 5,221,428 | 6/1993 | Ohsawa et al. . |
| 5,349,238 | 9/1994 | Ohsawa et al. . |
| 5,437,764 | 8/1995 | Ohsawa et al. . |
| 5,767,569 | 6/1998 | Ohta et al. . |

*Primary Examiner*—Olik Chaudhuri
*Assistant Examiner*—Alonzo Chambliss
*Attorney, Agent, or Firm*—Hill & Simpson

[57] ABSTRACT

A method of manufacturing a lead frame comprises the steps of preparing a three-layered material comprising a metal base, an etching stopper layer made of a metal material different from that of the metal layer formed on a first surface of the metal base and a chromium layer formed on the etching stopper layer, forming a resist layer having a negative pattern relative to an inner lead to be formed on the chromium layer of the three-layered material, forming an inner lead by plating copper by using the resist layer as a mask, forming an outer lead on the metal base, removing a back of a region in which an inner lead of the metal base is formed by etching, removing the etching stopper layer, and removing the chromium layer.

8 Claims, 3 Drawing Sheets

METHOD OF MANUFACTURING LEAD FRAME HAVING INNER LEAD CONNECTED TO OUTER LEAD BY METAL ETCH STOP LAYER

BACKGROUND OF THE INVENTION

The present invention relates to a method of manufacturing a lead frame in which an inner lead is connected to an end of an outer lead through an etching stopper portion made of a metal material different from that of the outer lead.

FIG. 1 of the accompanying drawings shows a lead frame which comprises an outer lead 41 made of copper, an etching stopper portion 42 made of aluminum formed on the surface of the base portion, a thin inner lead 43 made of copper connected to the etching stopper portion 42 and a bump 44 made of aluminum or the like connected to the tip end of the inner lead 43. When in use, this lead frame is generally bonded to an electrode pad 46 of a semiconductor chip 45 through the bump 44 and the semiconductor chip 45 is sealed by a sealing resin 47.

When such lead frame is manufactured, as shown in FIG. 2, there is used a cladding member 511 of trilayer structure in which a thick outer lead copper layer 58, an etching aluminum layer 59 and a thin inner lead copper layer 510 are laminated. Specifically, in the cladding member 511, the outer lead copper layer 58 is selectively etched and the inner lead copper layer 510 is selectively etched, thereby resulting in a lead frame being manufactured. In this manufacturing process, since the etching stopper aluminum layer 59 is provided, the outer lead can be prevented from being corroded by the inner lead etching and the inner lead can be prevented from being corroded by the outer lead etching.

However, when such lead frame is manufactured, the patterning of the outer lead 41 should be inevitably formed by one-side etching so that a side etching amount is inevitably increased. As a consequence, each lead cannot be fine pitched and a demand for ultra-high integration cannot be satisfied sufficiently. That is, while the width of the inner lead and the spacing thereof are about 75 μm, the width and spacing of the inner lead should be about 35 μm in accordance with the demand of ultra-high integration. A method in which the inner lead is formed by etching cannot cope with the above demand, and it is very difficult to manufacture such lead frame from a manufacturing process standpoint.

Recently, in order to solve the aforesaid problem, there is provided a method in which the inner lead 43 is not directly formed by etching the inner lead copper layer 510 of the cladding member 511 but the inner lead is formed by plating copper on the inner lead copper layer 510 by using a resist film as a mask.

However, in the method of making an inner lead by plating copper on the inner lead copper layer 510, the above copper layer 510 is removed by etching after the inner lead was formed by plating. In that case, the inner lead is similarly made of copper so that the inner lead should be left and only the copper layer 510 should be etched. To carry out such fine etching, an exclusively-used expensive soft etchant (e.g., mixed liquid of hydrogen peroxide, sulfuric acid and fluorine acid) becomes necessary, which makes the resultant lead frame expensive. In addition, even when such soft etchant is used, the condition of such etching process, e.g., etching rate is difficult to be managed. If such management of etching rate is insufficient, there is then the risk that the inner lead also is etched. Therefore, this method is not sufficient from a standpoint of quality stability.

Further, since such soft etching process is difficult to be managed, the thickness of the copper layer 510 which exerts a large influence on this process is required to have a sufficiently high accuracy. As a result, the method of manufacturing lead frame becomes difficult.

Furthermore, in the above-mentioned method, when the inner lead is processed by electrolytic plating, an abnormal precipitated portion tends to be formed on the inner lead precipitated by the electrolytic plating. Moreover, since there is provided an etching stopper aluminum layer 59, most of the aluminum layer 59 is removed by etching, and hence the thickness of the aluminum layer 59 cannot be increased more than is necessary from a manufacturing cost standpoint and an etching process standpoint. Therefore, when the outer lead copper layer 58 is selectively etched, the aluminum layer 59 cannot function sufficiently as a barrier (etching stopper layer). As a consequence, a failure in manufacturing such as disconnection or broken-off tends to occur in the inner lead provided on the side opposite to the outer lead copper layer 58.

Since the failure in manufacturing tends to occur, yield is very low, which causes a manufacturing cost to be increased. Therefore, it is desired to prevent the failure in manufacturing.

SUMMARY OF THE INVENTION

In view of the aforesaid aspect, it is an object of the present invention to provide a method of manufacturing lead frame in which a process control is easy, a quality is satisfactorily stable and a lead frame become inexpensive.

It is another object of the present invention to provide a method of manufacturing a lead frame in which an abnormal precipitated portion can be prevented when an inner lead is precipitated by electrolytic plating and in which an inner lead can be protected from a bad influence in the etching process.

In accordance with the present invention, there is provided a method of manufacturing a lead frame comprises the steps of preparing a three-layered material comprising a metal base, an etching stopper layer made of a metal material different from that of the metal layer formed on a first surface of the metal base and a chromium layer formed on the etching stopper layer, forming a resist layer having a negative pattern relative to an inner lead to be formed on the chromium layer of the three-layered material, forming an inner lead by plating copper by using the resist layer as a mask, forming an outer lead on the metal base, removing a back of a region in which an inner lead of the metal base is formed by etching, removing the etching stopper layer, and removing the chromium layer.

Preferably, the inner lead is formed such that an end portion of the inner lead is connected to the surface of the metal base.

According to the method of manufacturing a lead frame of the present invention, there is used the three-layered material comprising the metal base, the etching stopper layer and the chromium layer, and the inner lead is formed on the etching stopper layer by plating copper on the metal base by using the plating resist layer as the mask. Therefore, when the chromium layer is removed after the inner lead was formed, the chromium layer is made of material different from the copper forming the inner lead so that the management thereof can be facilitated as compared with the case that the chromium layer and the inner lead are made of the same material. Also, there is then no risk that the inner lead will be removed simultaneously.

When the inner lead is formed, if the base end of the inner lead is connected to the surface of the metal base and the outer lead is formed such that this connected portion becomes a part of the outer lead, then the outer lead and the inner lead are directly connected so that a bonding strength therebetween can be increased and that a potential difference can be prevented from being produced therebetween. Accordingly, when a semiconductor chip is mounted on this lead frame, sealed by a resin and used as an IC, even if water enters the sealed resin due to aging, then a local battery is formed among the inner lead, the outer lead and the etching stopper portion, thereby preventing the etching stopper portion from being corroded.

In accordance with another aspect of the present invention, there is provided a method of manufacturing a lead which comprises the steps of preparing a cladding member composing a metal base, an etching stopper layer formed on one surface of the metal base, a barrier layer formed on the etching stopper layer, and a close-contact layer formed on the barrier layer, the etching stopper layer being made of a material different from that of the metal base, and the barrier layer being made of a material different from those of the metal base and the etching stopper layer, forming a resist layer having a negative pattern relative to an inner lead to be formed on the close-contact layer of the cladding member, forming an inner lead by plating copper by using the resist layer as a mask, forming an outer lead on the metal base, removing a back of a region in which the inner lead of the metal base is disposed by etching, removing the etching stopper layer, removing the barrier layer, and removing the close-contact layer.

According to the lead frame cladding member used in the manufacturing method of another aspect of the present invention, if the barrier layer is made of a metal whose ionization tendency lies between ionization tendency of a metal forming the etching stopper layer and ionization tendency of a metal forming the close-contact layer, then a local battery can be prevented from being formed between the etching stopper layer and the close-contact layer. Also, even though the local battery is formed between the barrier layer and the etching stopper layer or between the barrier layer and the close-contact layer, an electromotive force thereof becomes small as compared with that of the local battery formed between the barrier layer and the close-contact layer. Therefore, a pin hole in the etching stopper layer or the like can be suppressed more effectively as compared with the prior art.

Furthermore, since the barrier layer is formed between the barrier layer and the close-contact layer, even if the pin hole or the like is formed in the close-contact layer due to the treatment on the close-contact side such as inner lead forming process, the barrier layer functions as a layer which can protect the etching stopper layer, thereby preventing the pin hole from being formed in the etching stopper layer.

Therefore, in the method of manufacturing a lead frame according to other aspect of the present invention, since the lead frame is manufactured by use of the lead frame cladding member, in the manufacturing process, it is possible to prevent an abnormal precipitated portion from being produced due to the pin hole formed on the etching stopper layer or the like of the lead frame clad layer when the inner lead is precipitated. Also, it is possible to prevent the failure in manufacturing of the inner lead from being caused in the selective etching when the outer lead is manufactured.

DETAILED DESCRIPTION OF THE PREFERRED EMBODIMENTS

A method of manufacturing a lead frame according to the present invention will hereinafter be described in detail with reference to the drawings.

Figure 3A:
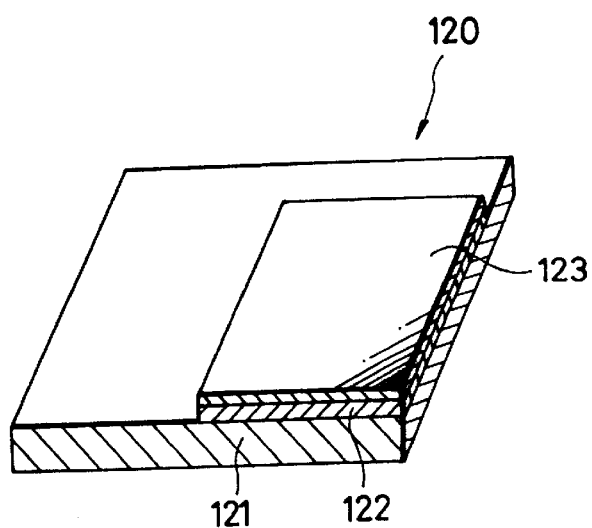
FIGS. 3A through 3C are manufacturing process diagrams used to explain a manufacturing method according to an embodiment of the present invention.

Prior to the manufacturing of lead frame, there is prepared a three-layered material 120 as shown in a fragmentary cross-sectional view in FIG. 3A. As shown in FIG. 3A, this three-layered material 120 comprises a plate-shaped metal base 121 made of copper alloy or 42 alloy, an etching stopper layer 122 formed on one surface of the metal base 121, and a chromium layer 123 formed on the etching stopper layer 122. The etching stopper layer 122 is formed by depositing aluminum (Al) on the metal base 120 by dry plating. The chromium layer 123 is formed by depositing chromium (Cr) on the etching stopper layer 122.

An alloy material having a predetermined thickness of about 150 $\mu$m is used as the metal base 121. The etching stopper layer 122 has a thickness ranging from 1.0 to 3.0 $\mu$m and the chromium layer 123 has a thickness ranging from 0.05 to 0.2 $\mu$m. The etching stopper layer 122 and the chromium layer 123 are formed on the metal base 121 at its predetermined region, i.e., at the portion corresponding to the region in which the inner lead is formed. The portion in which only the outer lead is formed is composed of only the metal base 121.

After the above-mentioned three-layered material 120 was prepared, a plating resist layer (not shown) having a negative pattern with respect to the inner lead to be formed is formed on the chromium layer 123 at its portion in which the inner lead is formed. When this resist pattern is formed, an electrodeposition resist (manufactured by Nihon Kagaku Sekiyu Kabushiki kaisha under trade name of OLIGO EC-UV), for example, is used as the resist material. A coating thickness lies in a range of about 10 to 30 $\mu$m. Moreover, the exposure amount used when the patterning is exposed lies in a range of about 150 to 400 mj/cm$^2$ and the development is carried out by spray method using 1% aqueous solution of Na$_2$CO$_3$ (45° C.).

Figure 3B:
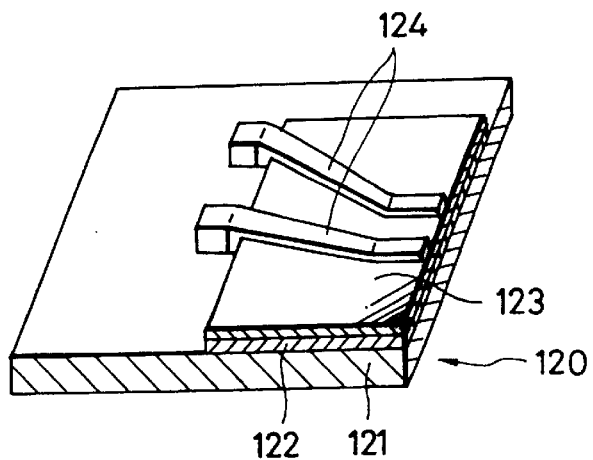

After the development was finished, the resultant product is acid-degreased. Further, if necessary, the surface of the chromium layer is activated and plated by copper sulfate, whereby the inner leads 124, . . . are formed on the chromium layer 123 formed on the surface of the etching stopper layer 123 as shown in FIG. 3B. The copper sulfate plating will be described more concretely. Metal plating liquid is such one that CuSO$_4$ is 80 g/l, H$_2$SO$_4$ is 200 g/l and Cl$^-$ ion is 50 ppm. Then, electroplating is carried out under the condition that current density lies in a range of from about 1.0 to 4.0 A/cm$^2$. A line width of the inner lead 124 thus formed is about 30 $\mu$m and the spacing between the leads is about 30 $\mu$m. Each inner lead 124 is formed such that, as shown in FIG. 3B, a base end portion is protruded from above the chromium layer 123 (i.e., etching stopper layer 122) to the outside and directly connected to the metal base 121.

After the inner leads 124, . . . were formed as described above, the plating resist layer is removed, and if necessary, reinforcing tapes (not shown) are bonded to the surface of the inner leads 124, . . . in the direction crossing the outer leads 125, . . . , thereby reinforcing the inner leads 124.

Figure 3C:
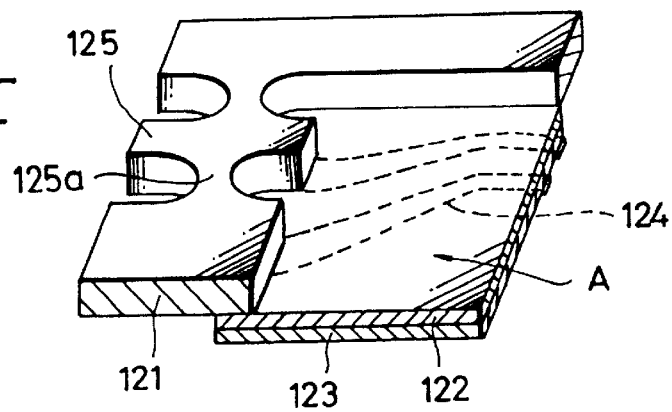

Then, a resist pattern (not shown) is formed on the back of the metal base 121, i.e., on the surface opposite to the side in which the inner leads 124, . . . are formed. Further, the outer leads 125, . . . , are formed by etching the metal base 120 by using the above resist pattern as a mask as shown in FIG. 3C. At the same time, the metal base 120 portion is removed from the back A in which the inner leads 124, . . . were previously formed by etching. At that time, since the chromium layer 123 and the etching stopper layer 122 are formed on the back of the inner leads 124, . . . , the inner leads 124, . . . are protected from being damaged by etching.

In the etching process at the back A portion in which the inner leads 124, . . . are formed, in particular, all portions corresponding to the etching stopper layer 122 formed on the back A are not removed but the portion corresponding to a predetermined width of the outer peripheral portion of the etching stopper layer 122 is left as it is. Accordingly, the pattern of the outer pattern 125, . . . is formed such that each of outer leads 125, . . . contains a portion corresponding to the portion left in the etching stopper layer 122 as one portion thereof.

Then, after the metal base 121 was removed by etching, the etching stopper layer 122 exposed to the back A in which the inner lead 124 is formed is removed by etching. In this etching process, it is natural that aluminum should be corroded but the outer lead 125 and the inner lead 124 should be prevented from being corroded. When the etching stopper layer 122 is removed by wet etching, phosphoric acid-based etchant is used. When the etching stopper layer 122 is removed by dry etching, reactive ion etching is carried out under the condition that $BCl_3$ (40 SCCM)+$Cl_2$ (100 SCCm)+He or $N_2$ (1500 SCCM) gas is used as etching gas, RF power is 220 w, pressure is 1340 Pa, table temperature is 5° C. and that etching rate is 7 $\mu$m.

When the etching stopper layer 122 is etched as described above, the metal base 121 is not removed and left at the predetermined portion of the outer peripheral portion corresponding to the remaining portion. This remaining portion becomes an etching stopper portion.

Thereafter, the chromium layer 123 exposed to the side opposite to the inner leads 124, . . . when the etching stopper layer 122 was removed is removed by the process using hydrochloric acid of proper concentration, whereby adjacent inner leads 124, 124 are completely separated from each other (of course, the inner leads 124, 124 are short-circuited by a diverging portion 125a of the outer lead 125 until the unnecessary portion of the outer lead 125 is cut after sealed by resin).

Then, a bump (not shown) is formed on the surface of the tip end portion of each inner lead by sputtering, photoetching of aluminum or the like, thereby resulting in a lead frame being obtained.

Figure 2:
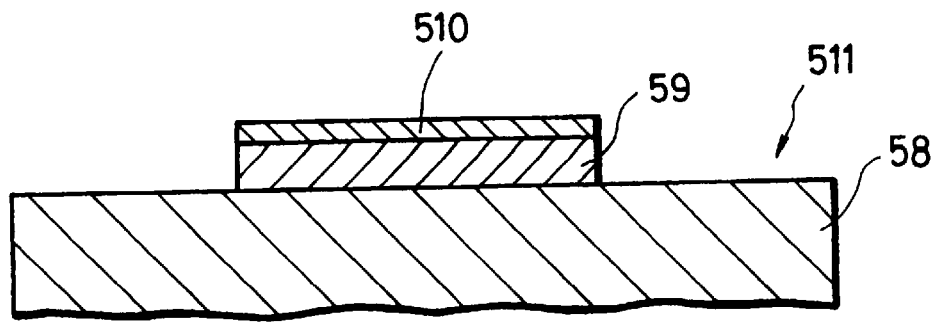
FIG. 2 is a cross-sectional side view showing an example of a three-layered material.

In the above-mentioned method of manufacturing a lead frame, the three-layered material 120 comprising the metal base 121, the etching stopper layer 122 and the chromium layer 123 is used, and the inner leads 124, . . . are formed on the etching stopper layer 122 by plating copper on the metal base layer 121 by using the plating resist layer as the mask. Therefore, when the chromium layer 123 was removed after the inner leads 124, . . . were formed, the chromium layer 123 is made of a material different from the copper forming the inner leads 124, . . . so that the management of such manufacturing process becomes easy. When the chromium layer 123 and the inner lead 124 are made of the same material, any special soft etchant should be used. In addition, the etching rate should be controlled sufficiently. Thus, as compared with the case that the film thickness of the copper layer 510 shown in FIG. 2 should be controlled strictly, it is possible to remove the chromium layer 123 only by the process using hydrochloric acid. Moreover, in the process using hydrochloric acid, the inner leads 124, . . . made of copper is not removed, and hence the process control become extremely easy.

Since the inner leads 124, . . . are formed such that the base end portions thereof are brought in contact with the metal base 121, the resultant lead frame is such one that the outer leads 125, . . . and the inner leads 124, . . . are directly connected. Accordingly, in this lead frame, a bonding strength between the outer leads 125, . . . and the inner leads 124, . . . is increased and a potential difference can be prevented from being produced between the outer leads 125, . . . and the inner leads 124, . . . Therefore, when the semiconductor chip is mounted on the lead frame, sealed by resin and used as an IC, even if water enters the sealed resin due to aging, a local battery is formed among the inner leads 124, . . . , the outer leads 125, . . . and the etching stopper portion (etching stopper layer 122), thereby preventing the etching stopper portion from being increasingly corroded.

As described above, the method of manufacturing a lead frame according to this embodiment is a method in which the three-layered material composing the metal base, the etching stopper layer and the chromium layer is used and the inner leads are formed on the etching stopper layer by plating copper on the metal base by using the plating resist layer as the mask. Therefore, when the chromium layer is removed after the inner leads were formed, the chromium layer is made of material different from the copper which makes the inner leads. Thus, as compared with the case that the chromium layer and the inner leads are made of the same material, the process control becomes easy and there is then no risk that the inner leads also will be removed simultaneously.

Specifically, since any special soft etchant need not be used, the manufacturing cost can be reduced. In addition, since the etching rate need not be controlled substantially and the film thickness of the chromium layer need not be controlled substantially so that the management of the manufacturing process can be made extremely easy. Thus, yield of the resultant product can be increased and the lead frame can become highly reliable. Further, as compared with the lead frame using the copper layer, the lead frame according to this embodiment uses the three-layered material in which the chromium layer made of material different from that of the inner lead is formed so that the thickness of the chromium layer can be decreased more than the lead frame using the copper layer. Thus, a time during which the three-layered material is manufactured can be reduced.

When the inner lead is formed, if the base end portion of the inner lead is connected to the surface of the metal base and the outer lead is formed such that this connected portion becomes a part of the outer lead, then the outer lead and the inner lead are connected directly so that a bonding strength between the outer lead and the inner lead can be increased and that a potential difference can be prevented from being produced therebetween. Therefore, when a semiconductor chip is mounted on this lead frame, sealed by resin and used as an IC, even if water enters the sealed resin due to aging, a local battery is formed among the inner lead, the outer lead and the etching stopper portion, thereby preventing the etching stopper portion from being increasingly corroded.

An embodiment of a lead frame in which a problem of abnormal precipitated portion can be solved will be described below.

Figure 5B:
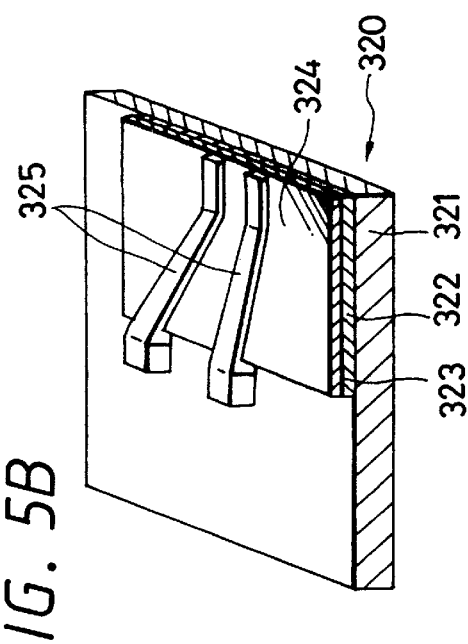
FIGS. 5A through 5C are partly-cross-sectional views used to explain a method of manufacturing a lead frame according to another embodiment of the present invention.
Figure 5C:
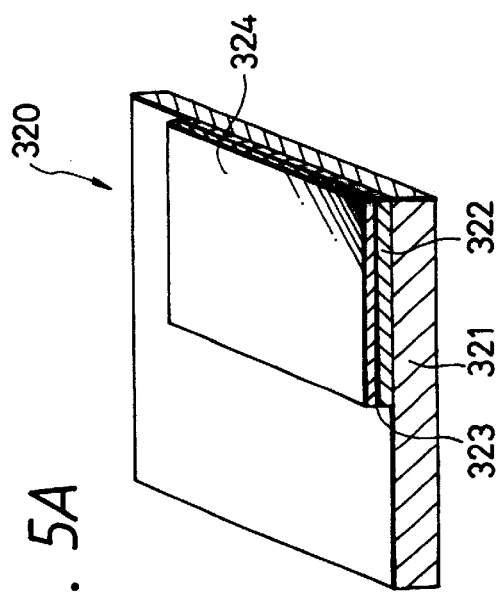
Figure 5A:
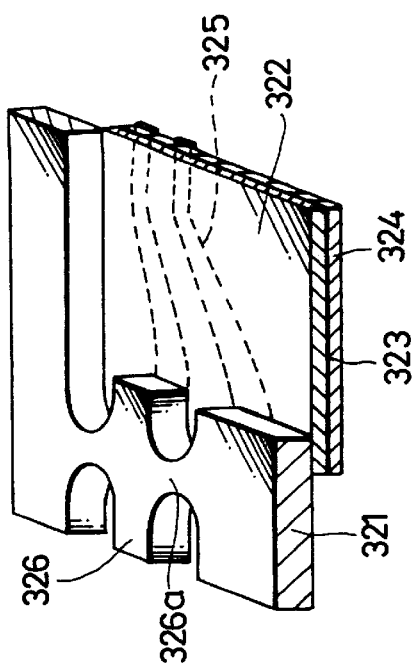

FIG. 5A is a fragmentary perspective view illustrative of a lead frame cladding member according to the embodiment of the present invention. In FIG. 5A, reference numeral 320 denotes a lead frame cladding member (hereinafter simply referred to as "cladding member"). As shown in FIG. 5A, this cladding member 320 comprises a plate-shaped metal base material 321, an etching stopper layer 322 formed on one surface of the metal base 321, a barrier layer 323 formed on the etching stopper layer 322 and a close-contact layer 324 formed on the barrier layer 323. A number of the laminated layer of three layers comprising the etching stopper layer 322, the barrier layer 323 and the close-contact layer 324 of very smaller area are formed on the metal base 320 at its predetermined positions.

The metal base 321 is a plate of about 150 $\mu$m in thickness made of copper, copper alloy or 42 alloy and serves as a member for forming an outer lead of a lead frame. The etching stopper layer 322 is made of aluminum and has a thickness ranging from 1.0 $\mu$m to 5.0 $\mu$m. The barrier layer 323 is made of chromium and has a thickness ranging from 0.1 $\mu$m to 0.2 $\mu$m. The close-contact layer 324 is made of copper and has a thickness ranging from 1.0 $\mu$m to 2.0 $\mu$m.

When such cladding member 320 is manufactured, Cu alloy (manufactured by Mitsubishi Shindoh Co., Ltd. under trade name of TAMAC-15) having the above-mentioned thickness is prepared as the metal base 321, for example. The surface layer is etched about 12 nm by vapor deposition ion beam and cleaned. After the surface oxide film was removed, vapor deposition (accumulation) process of aluminum (Al), chromium (Cr) and copper (Cu) is carried out at predetermined position by sputtering, in that order, thereby forming the etching stopper layer 322, the barrier layer 323 and the close-contact layer 324 each having the thickness of the above-mentioned range.

The reason that the barrier layer 323 is made of chromium is that ionization degree (ionization tendency) of chromium lies between ionization tendency of aluminum for making the etching stopper layer 322 and ionization tendency of copper for making the close-contact layer 324, chromium can be easily vapor-deposited in the manufacturing process and that chromium can adhere to aluminum and copper relatively satisfactorily. However, the most important reason that the barrier layer 323 is made of chromium is that when a lead frame was manufactured by using the cladding member 320 in which the barrier layer 323 was made of chromium, yield of lead frame could be improved remarkably.

The reason for setting the thickness of the etching stopper layer 322 within the range from 1.0 $\mu$m to 5.0 $\mu$m is as follows. If the thickness of the etching stopper layer 322 is set smaller than 1.0 $\mu$m, pin holes are formed in the etching stopper layer 322 when the etching stopper layer 322 is deposited by evaporation, which prevents the etching stopper layer 322 from sufficiently serving as an etching stopper layer for protecting an inner lead side when the metal base 321 is selectively etched to form the outer lead. If on the other hand the thickness of the etching stopper layer exceeds 5 $\mu$m, costs for manufacturing the etching stopper is disadvantageously increased, and an etching time required when the etching stopper layer 322 is finally etched away is increased, which increases a loss in fabrication of the lead frame.

The reason for setting the thickness of the barrier layer 323 within the range from 0.1 $\mu$m to 0.2 $\mu$m is similar to that of the etching stopper layer 322 as described below. If the thickness of the barrier layer 323 is set smaller than 0.1 $\mu$m, then the barrier layer 323 does not function sufficiently as a barrier layer. If on the other hand the thickness exceeds 0.2 $\mu$m, then the costs for manufacturing the barrier layer 323 is disadvantageously increased and further a loss caused when it is etched away is increased. However, since the barrier layer 323 is formed to function as an auxiliary for the etching stopper layer 322, the barrier layer 323 can function sufficiently with the thickness thereof being considerably smaller as compared with the that of the etching stopper layer 322.

The reason for setting the thickness of the close-contacting layer 324 within the range from 1.0 $\mu$m to 2.0 $\mu$m is as follows. If the thickness of the close-contacting layer 324 is set smaller than 1.0 $\mu$m, then pin holes are formed therein, which prevents the close-contacting layer 324 from being satisfactorily bonded to the inner lead formed thereon by electrolytic plating and which may further cause an abnormal deposition. If on the other hand the thickness of the close-contacting layer 324 exceeds 2.0 $\mu$m, then an etching time required for finally removing the bonding layer 24 by etching is increased, and it becomes difficult to carry out an etching process described later on because the close-contacting layer 324 is made of the same material as that of the inner lead formed thereon.

A method of manufacturing a lead frame employing the cladding member 320 with such structure according to an embodiment of the present invention will be described.

Initially, the cladding member 320 shown in FIG. 5A is prepared. A dry film (not shown) is bonded at a position where the inner leads are to be formed on the close-contacting layer 324. The dry films are subjected to known exposure and development processes with an exposure mask being employed, to form a negative pattern with respect to the inner lead to be formed thereon. Thus, the plating mask layer used in the present invention is obtained.

After the pattern is formed, the plating mask layer is degreased if necessary. A surface of the close-contacting layer 324 is activated by using sulfuric acid or the like. Then, the close-contacting layer 324 is plated with copper sulfate, thereby the copper inner leads 325 being formed on the close-contacting layer 324 deposited on the barrier layer 323 as shown in FIG. 5B. A specific process of the copper-sulfate plating will be described. Electric plating is carried out with current density ranging from 1.0 to 4.0 A/dm$^2$ by employing solution for plating which contains CuSO$_4$ of 80 g/l, H$_2$SO$_4$ of 200 g/l and Cl$^-$ ion of 50 ppm. The inner lead 325 thus formed has a line width of about 35 $\mu$m and a thickness of 30 $\mu$m and an interval between the adjacent inner leads 325 is set to about 35 $\mu$m. Each of the inner leads 325 is formed as shown in FIG. 5B so that its base end portion should be extended outward from the close-contacting layer 324 (i.e., the etching stopper layer 323) and directly bonded to the metal base 321.

After the inner leads 325 are thus formed, the above dry film (plating mask layer) is removed. If necessary, a reinforcement tape (not shown) is bonded on a surface of the inner leads 325 in the direction perpendicular to the inner leads 325 to reinforce the inner leads 325. Even though the close-contacting layer 324 side is exposed to various chemical reactions resulting from various solutions in the process of forming the inner leads 325, the barrier layer 323 formed under the close-contacting layer 324 and on the etching stopper layer 322 prevents the etching stopper layer 322 from having pin holes.

A resist pattern (not shown) is formed on a rear surface of the metal base 321, i.e., on a surface opposite to the side where the inner leads 325 are formed. While the resist pattern is being employed as a mask, the metal base 321 is selectively etched by using an etchant containing hydrogen peroxide and sulfuric acid, thereby the outer leads 326 being formed as shown in FIG. 5C. Simultaneously with this process, the metal base 321 is selectively etched on the rear side of the portion where the inner leads 325 are previously formed. At this time, since the close-contacting layer 324, the chromium barrier layer 323 and the aluminum etching stopper layer 322 are formed on the rear side of the inner leads 325, the inner leads 325 are protected from damages which may result from the selective etching.

When the metal base 321 is etched on the side opposite to the side where the inner leads 325 are formed, the metal base 321 is not removed at all portions corresponding to the etching stopper layer 322 formed thereon but removed so that its portions corresponding to an outer periphery portion of the etching stopper layer 322 with a predetermined width should be left. Therefore, the outer leads 326 are formed in such a pattern that the outer leads 326 have parts left on the etching stopper layer 322.

After the metal base 321 is thus etched away, the etching stopper layer 322 exposed on the rear side of the portion where inner leads 325 are formed is removed by etching. This etching must be carried out so that aluminum should be etched and the outer leads 326 and the inner leads 325 should not be etched. In the case of the wet etching, an etchant made of phosphoric acid is employed. In the case of dry etching, $BCl_3$ (40 SCCM)+$Cl_2$ (100 SCCM)+He or $N_2$ (1500 SCCM) are employed as an etching gas, and reactive ion etching is carried out under the condition that an RF power is 220 W, a pressure is 1340 pa, a table temperature is 5° C. and an etching speed is 7 $\mu$m/240 sec.

When the etching stopper layer 322 is etched as described above, the barrier layer 323 formed on the rear surface of the etching stopper layer 322 is simultaneously removed because its thickness is considerably thin as compared with the etching stopper layer 322. It is needless to say that an etching time is increased as compared with the etching of the lead frame having no barrier layer.

As described above, the etching stopper layer 322 and the barrier layer 323 are not removed and but partially left at a predetermined portion of the outer periphery portion of the etching stopper portion 322 corresponding to the portion where the metal base 321 is not removed but left. The left portion will serve as an etching stopper portion.

Thereafter, since the etching stopper layer 322 is removed, the close-contacting layer 324 is exposed to the side opposite to the inner leads 325. The close-contacting layer 324 is etched away by using an etchant containing hydrogen peroxide, sulfuric acid and hydrofluoric acid, for example, thereby each of the adjacent inner leads 325 being separated completely (it is needless to say that until unnecessary portions of the outer leads 326 are cut after sealed with resin, the inner leads 325 are short-circuited by diverging portions 326a of the outer leads 326). In the next etching process, it is difficult to selectively remove only the close-contacting layer 324 by etching because the close-contacting layer 324 is made of copper similarly to the inner leads 325. Therefore, by taking advantage of difference in thickness between the inner lead 325 and the close-contacting layer 324 (the inner lead 325 has the thickness of about 30 $\mu$m and the close-contacting layer 324 has the thickness of from 1.0 $\mu$m to 2.0 $\mu$m), the inner leads 325 and the close-contacting layer 324 are simultaneously etched such that the close-contacting layer 324 is reliably removed and each of the inner leads 325 has the sufficient thickness of about 25 $\mu$m.

A bump (not shown) is formed on a head end portion surface of each of the inner leads 325 by aluminum sputtering, photo etching or the like to obtain the lead frame.

In the above-mentioned method of manufacturing the lead frame, since the cladding member 320 has the aluminum etching stopper layer 322, the copper close-contacting layer 324, and the chromium barrier layer 323 formed therebetween, the lead frame according to the present invention can achieve the following effects.

Figure 1:
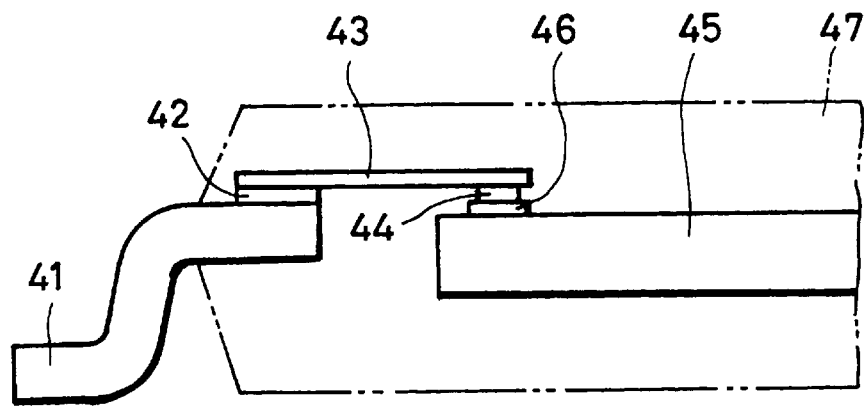
FIG. 1 is a cross-sectional side view showing an example of a lead frame.

Since ionization tendency of chromium forming the barrier layer 323 is between those of the aluminum forming the etching stopper layer 322 and copper forming the close-contacting layer 324, it is possible to prevent a local battery from being formed between the etching stopper layer 322 and the close-contacting layer 324. Moreover, even if the local battery is formed between the barrier layer 323 and the close-contacting layer 324, an electromotive force of the local battery is small as compared with that of a local battery to be formed between the etching stopper layer 322 and the close-contacting layer 324. Therefore, it is possible to suppress the pin holes formed in the etching stopper layer 322 and so on as compared with the method of the manufacturing the lead frame described with reference to FIGS. 1 and 2. As a result, it is possible to prevent the abnormal deposition of the inner lead 325 resulting from the pin holes.

Since the barrier layer 323 is formed between the close-contacting layer 324 the etching stopper layer 322, the barrier layer 323 functions as a layer for protecting the etching stopper layer 322 upon the processing on the side of the close-contacting layer 324 such as the inner lead forming process or the like. Therefore, it is possible to prevent the pin holes from being formed in the etching stopper layer 322, which can consequently prevent the inner leads 325 from being unsatisfactorily manufactured when the selective etching carried out when the outer leads 326 are formed.

Further, since the inner leads 125, . . . are formed such that the base end portions thereof are brought in contact with the metal base 321, the resultant lead frame is such one that the outer leads 326, . . . and the inner lead 325, . . . are connected directly. Accordingly, in this lead frame, the bonding strength between the outer leads 326, . . . and the inner leads 325 can be increased and the potential difference can be prevented from being produced therebetween. Therefore, when the semiconductor chip is mounted on this lead frame, sealed by resin and used as an IC, even if water enters the sealed resin due to aging, then the local battery is formed among the inner leads 325, . . . , the outer leads 326, . . . and the etching stopper portion (etching stopper layer 322), thereby preventing the etching stopper portion from being increasingly corroded.

While the negative pattern of the inner lead is formed by the dry film before the inner lead is formed as described above, the present invention is not limited thereto and a plating resist layer may be formed by using the resist material such as electrodeposition resist (manufactured by Nihon Kagaku Sekiyu Kabushiki Kaisha under trade name of OLIGO EC-UV). Then, a negative pattern may be formed on this plating resist layer by known exposure and development and used as an inventive plating mask layer.

EXPERIMENTAL EXAMPLE

Aluminum, chromium and copper were sequentially deposited on a square metal base made of copper, thereby forming an etching stopper layer made of aluminum having a thickness of 1.3 μm, a barrier layer made of chromium having a thickness of 0.2 μm and a close-contact layer made of copper having a thickness of 2.0 μm, respectively. Thus, there were formed eight cladding members with the layer arrangement shown in FIG. 5A were made. Apart from the above, aluminum and copper were sequentially deposited on the same metal base as the above-mentioned metal base, thereby forming an etching stopper layer made of aluminum having a thickness of 1.3 μm and a close-contact layer made of copper having a thickness of 2.0 μm. Thus, there were formed six cladding members with the conventional layer arrangement.

Figure 4:
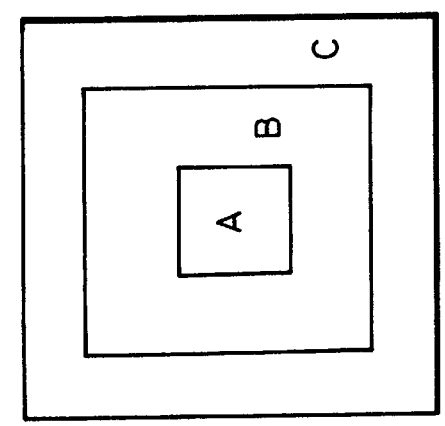
FIG. 4 is a plan view of a cladding member showing a potting region.

The close-contact layer surfaces of the resultant cladding members were set to area A, area B and area C in the sequential order from the center as shown in FIG. 4. Potting was carried out on the area A which serves as II/L center exposed portion and the area C which serves as a ball grid area. No potting was effected on the area B which serves as a polyimide tape area. The potting was carried out in a manual fashion.

Then, in each cladding member, a resist pattern was formed on the metal base surface. Thereafter, the metal base was etched by selective etching using an etchant comprising hydrogen peroxide water and sulfuric acid.

Then, the number of pin holes formed on the etching stopper layer (aluminum layer), exposed by etching, of each cladding member thus etched was visually counted by electron microscope photograph.

In the inventive cladding member, it was visually confirmed that about 14 to 70 pin holes were produced in any of the areas A, B and C. On the other hand, in the cladding members according to the comparative examples, more than 150 pin holes were produced in all areas A, B and C of the three cladding members in the six cladding members. Moreover, more than 150 pin holes were produced in the area A, B and C of the remaining three cladding members. Accordingly, it was confirmed that the occurrence of pin holes in the inventive cladding member is reduced to $1/3$ to $1/20$ as compared with the comparative examples.

According to the measured results, it was confirmed that the failure in manufacturing caused by the pin hole could be decreased as compared with the prior art.

As described above, in the lead frame cladding member according to the present invention, since the barrier layer made of metal material different from that of the etching stopper layer is formed between the etching stopper layer and the close-contact layer, if the barrier layer is made of metal whose ionization tendency lies between ionization tendency of metal forming the etching stopper layer and ionization tendency of metal forming the close-contact layer, then the local battery is difficult to be formed between the etching stopper layer and the close-contact layer so that the pin hole in the etching stopper layer or the like can suppressed from being formed more effectively. Thus, an abnormal precipitated portion can be prevented from being formed when the inner lead is precipitated so that a manufacture failure can be reduced and yield can be improved. Thus, the manufacturing cost can be decreased.

Further, since the barrier layer is formed between the close-contact layer and the etching stopper layer and the barrier layer functions as a layer for protecting the etching stopper layer when the processing on the close-contact layer such as the processing for forming the inner lead is carried out, in this processing, the pin hole can be prevented from being formed in the etching stopper layer. Thus, a failure in manufacturing of inner lead in the selective etching executed when the outer lead is formed can be prevented and a failure in manufacturing can be reduced. Thus, yield can be improved and the manufacturing cost can be decreased.

According to the present invention, when the lead frame is manufactured, the abnormal precipitated portion can be prevented from being formed due to the pin hole formed on the etching stopper layer of the lead frame cladding member when the inner lead is precipitated. Also, a failure in manufacturing of inner lead can be prevented from being caused in the selective etching process when the outer lead is manufactured. Thus, yield can be improved and the manufacturing cost can be reduced.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing a lead frame comprising the steps of:

preparing a three-layered material comprising a metal base, an etching stopper layer made of a metal material different from that of said metal base formed on a first surface of said metal base and a chromium layer formed on said etching stopper layer;

forming a resist layer having a negative pattern relative to a lead to be formed on said chromium layer of said three-layered material;

forming the lead by plating copper by using said resist layer as a mask;

removing a back of a region in which the lead of said metal base is formed by etching;

removing said etching stopper layer; and removing said chromium layer.

2. A method of manufacturing a lead frame as claimed in claim 1, in which said lead is formed such that an end portion of said lead is connected to the surface of said metal base.

3. A method of manufacturing a lead comprising the steps of:

preparing a cladding member composing a metal base, an etching stopper layer formed on one surface of said metal base, a barrier layer formed on said etching stopper layer, and a close-contact layer formed on said barrier layer, said etching stopper layer being made of a material different from that of said metal base, and said barrier layer being made of a material different from those of said metal base and said etching stopper layer;

forming a resist layer having a negative pattern relative to an inner lead to be formed on said close-contact layer of said cladding member;

forming an inner lead by plating copper by using said resist layer as a mask;

forming an outer lead on said metal base;

removing a back of a region in which said inner lead of said metal base is disposed by etching;

removing said etching stopper layer;

removing said barrier layer; and removing said close-contact layer.

4. A method of manufacturing a lead frame as claimed in claim 3, wherein said metal base is made of copper or copper alloy, said etching stopper layer is made of aluminum and said close-contact layer is made of copper.

5. A method of manufacturing a lead frame as claimed in claim 3, wherein said etching stopper layer has a thickness ranging from 1 $\mu$m to 5 $\mu$m.

6. A method of manufacturing a lead frame as claimed in claim 3, wherein said barrier layer has a thickness ranging from 0.1 $\mu$m to 0.5 $\mu$m.

7. A method of manufacturing a lead frame as claimed in claim 3, wherein said close-contact layer has a thickness ranging from 1 $\mu$m to 2 $\mu$m.

8. A method of manufacturing a lead frame as claimed in claim 3, wherein said barrier layer has an ionization tendency between an ionization tendency of metal forming said etching stopper layer and an ionization tendency of metal forming said close-contact layer.

* * * * *